(12) United States Patent
Lu

(10) Patent No.: US 10,192,975 B2
(45) Date of Patent: Jan. 29, 2019

(54) LOW TEMPERATURE POLYCRYSTALLINE SILICON THIN FILM TRANSISTOR

(71) Applicant: Wuhan China Star Optoelectronics Technology Co., Ltd., Wuhan, Hubei (CN)

(72) Inventor: Gaiping Lu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 205 days.

(21) Appl. No.: 14/916,187

(22) PCT Filed: Jan. 20, 2016

(86) PCT No.: PCT/CN2016/071397
§ 371 (c)(1),
(2) Date: Mar. 3, 2016

(87) PCT Pub. No.: WO2017/107274
PCT Pub. Date: Jun. 29, 2017

(65) Prior Publication Data
US 2018/0047830 A1    Feb. 15, 2018

(30) Foreign Application Priority Data
Dec. 21, 2015   (CN) .......................... 2015 1 0964883

(51) Int. Cl.
*H01L 29/66*   (2006.01)
*H01L 29/78*   (2006.01)
(Continued)

(52) U.S. Cl.
CPC .. *H01L 29/66757* (2013.01); *H01L 21/02532* (2013.01); *H01L 21/02592* (2013.01);
(Continued)

(58) Field of Classification Search
CPC . H01L 29/66757; H01L 29/786; H01L 27/12; H01L 27/3272
See application file for complete search history.

(56) References Cited

U.S. PATENT DOCUMENTS 7,233,372 B2 *  6/2007  Murade ............. G02F 1/133512
                                                  349/110
7,554,118 B2 *  6/2009  Kim ....................... H01L 27/12
                                                   257/72
(Continued)

FOREIGN PATENT DOCUMENTS

CN    1638022 A    7/2005
CN    101127359 A  2/2008
(Continued)

*Primary Examiner* — Ida M Soward
(74) *Attorney, Agent, or Firm* — Andrew C. Cheng

(57) ABSTRACT

The disclosure relates to a low temperature polycrystalline silicon thin film transistor including: a substrate; a buffer layer formed on the substrate; a semiconductor layer formed on the buffer layer; a gate insulation layer formed on the buffer layer and the semiconductor layer; gates formed on the gate insulation layer; a dielectric layer formed on the gate insulation layer and the gates; a passivation layer formed on the dielectric layer; a first contact hole and a second contact hole formed respectively inside the passivation layer, the dielectric layer and the gate insulation layer, and sources ad drains formed respectively on the first contact hole and the second contact hole; the semiconductor layer being a low temperature poly silicon layer, and a reflective layer and/or an insulation layer disposed between the buffer layer and the semiconductor layer. The disclosure further relates to a manufacturing method for aforementioned thin film transistor.

14 Claims, 10 Drawing Sheets

(51) Int. Cl.
  *H01L 27/12* (2006.01)
  *H01L 27/32* (2006.01)
  *H01L 29/786* (2006.01)
  *H01L 21/02* (2006.01)
  *H01L 21/306* (2006.01)

(52) U.S. Cl.
  CPC .. *H01L 21/02595* (2013.01); *H01L 21/02667* (2013.01); *H01L 21/30604* (2013.01); *H01L 27/12* (2013.01); *H01L 27/1229* (2013.01); *H01L 27/1281* (2013.01); *H01L 27/3272* (2013.01); *H01L 29/786* (2013.01); *H01L 21/0262* (2013.01)

(56) References Cited

U.S. PATENT DOCUMENTS

| | | | | |
|---|---|---|---|---|
| 7,863,617 | B2* | 1/2011 | Hioki | G02F 1/133305 257/59 |
| 8,952,358 | B2* | 2/2015 | Park | H01L 51/5284 257/40 |
| 9,064,831 | B2* | 6/2015 | Noh | H01L 27/3272 |
| 9,305,984 | B2* | 4/2016 | Kang | H01L 51/5253 |
| 9,324,740 | B2* | 4/2016 | Lee | H01L 27/3241 |
| 9,337,212 | B2* | 5/2016 | Chen | H01L 27/1218 |
| 9,356,239 | B2* | 5/2016 | Hsu | H01L 51/002 |
| 9,818,766 | B2* | 11/2017 | Kim | H01L 27/124 |
| 2003/0180979 | A1* | 9/2003 | Katayama | G02F 1/1368 438/30 |
| 2005/0116292 | A1* | 6/2005 | Koo | H01L 21/02422 257/347 |
| 2008/0042131 | A1* | 2/2008 | Morimoto | H01L 27/12 257/59 |
| 2008/0073656 | A1* | 3/2008 | Peng | H01L 27/1214 257/79 |
| 2008/0087889 | A1* | 4/2008 | Chan | H01L 27/1229 257/40 |
| 2008/0128704 | A1 | 6/2008 | Morimoto | |
| 2011/0120755 | A1* | 5/2011 | Lee | H01L 27/1214 174/254 |

FOREIGN PATENT DOCUMENTS

| | | |
|---|---|---|
| CN | 103928341 A | 7/2014 |
| CN | 203895510 U | 10/2014 |
| CN | 104465401 A | 3/2015 |
| CN | 104900710 A | 9/2015 |
| CN | 105097666 A | 11/2015 |
| CN | 105097667 A | 11/2015 |
| CN | 101075555 A | 11/2017 |
| JP | 2001274087 A | 10/2001 |
| JP | 2009147256 A | 7/2009 |
| KR | 20070010805 A | 1/2007 |
| KR | 10-0742384 B1 | 7/2007 |

* cited by examiner

LOW TEMPERATURE POLYCRYSTALLINE SILICON THIN FILM TRANSISTOR

BACKGROUND OF THE INVENTION

1. Field of the Invention

The disclosure relates to display technical field, specifically a low temperature polycrystalline silicon thin film transistor and manufacturing thereof.

2. Discussion of the Related Art

Thin Film Transistor (TFT) is used to as switch in liquid crystal display device, the property of TFT includes lower power consumption, smaller size and lower driving voltage, and is suitable for computer, laptop and any other display device. In the present liquid crystal display device, active layer of thin film transistor mainly use amorphous silicon (a-Si), but thin film transistor using amorphous silicon as active layer has very low mobility and is difficult to meet the driving requirement of peripheral circuit; hence, Low Temperature Poly-silicon instead of amorphous silicon technology emerged.

The mobility of Low temperature polycrystalline silicon may up to 100 $cm^2/V \cdot S$ to meet the driving requirement of peripheral circuit, and is more suitable than amorphous silicon to use in the active layer of thin film transistor so that it is more compact than amorphous silicon thin film transistor. The principle of manufacturing structure of Low temperature polycrystalline silicon thin film transistor is that excimer laser is used to be a heat source to project on an amorphous silicon structure of a glass substrate, and then the amorphous silicon structure substrate is turned into a polycrystalline silicon structure after absorbing energy of excimer laser.

The present technical process includes mainly traditional Excimer Laser Annel (ELA) method without using mask and Sequential Lateral Solidification (SLS) with using mask to control laser irradiation region. By applying traditional ELA method, grain size of low temperature polycrystalline silicon generally is under 0.1 µm; by applying SLS method, crystallization procedure is induced from end of the irradiation region to inside, and then crystallization of the center of the irradiation portion is executed. Obviously, grain size of the polycrystalline silicon manufactured by above two methods are smaller to limit the practical application of polycrystalline silicon.

SUMMARY

In order to overcome the insufficient of present technology, purpose of the disclosure is to provide a low temperature polycrystalline silicon thin film transistor and manufacturing thereof; finally, larger grain size of polycrystalline silicon is manufactured by the method and improves electron mobility of thin film transistor to meet the driving demand of peripheral circuits.

The disclosure provides a low temperature polycrystalline silicon thin film transistor, and the thin film transistor includes:
a substrate;
a buffer layer formed on the substrate;
a semiconductor layer formed on the buffer layer;
a gate insulation layer formed on the buffer layer and the semiconductor layer;
gates formed on the gate insulation layer;
a dielectric layer formed on the gate insulation layer and the gates;
a passivation layer formed on the dielectric layer;
a first contact hole and a second contact hole formed respectively inside the passivation layer, the dielectric layer and the gate insulation layer, and sources ad drains formed respectively on the first contact hole and the second contact hole.

Wherein, the semiconductor layer is a low temperature poly silicon layer, and a reflective layer and/or an insulation layer are disposed between the buffer layer and the semiconductor layer.

Further, the low temperature polycrystalline silicon thin film transistor comprises a pixel thin film transistor and a driving thin film transistor, the substrate comprises a pixel region and a peripheral driving region, the pixel region is used for forming the pixel thin film transistor, and the peripheral driving region is used for forming the driving thin film transistor;

the driving thin film transistor comprises a substrate located inside the peripheral driving region, and all the buffer layer, the semiconductor layer, the gate insulation layer, gates, the dielectric layer and the passivation layer formed sequentially from the top on the substrate inside the peripheral driving region; the first contact hole and the second contact hole are formed respectively inside the passivation layer, the dielectric layer and the gate insulation layer, and the sources and the drains are formed respectively on the first contact hole and the second contact hole; wherein, the reflective layer and/or the insulation layer are disposed between the buffer layer and the semiconductor layer.

Further, the pixel thin film transistor comprises: a substrate inside the pixel region, and all the buffer layer, the semiconductor layer, the gate insulation layer, gates, the dielectric layer and the passivation layer formed sequentially from the top on the substrate inside the pixel region; the first contact hole and the second contact hole are formed respectively inside the passivation layer, the dielectric layer and the gate insulation layer, and the sources and the drains are formed respectively on the first contact hole and the second contact hole.

Further, a grain size of the semiconductor layer located inside the driving thin film transistor is larger than a grain size of the semiconductor layer located inside the pixel thin film transistor.

Further, the buffer layer comprises a first buffer layer formed on the substrate, the reflective layer is formed on the first buffer layer, a second buffer is formed on the first buffer layer and the reflective layer, the reflective layer is covered inside the second buffer layer, and the semiconductor layer is formed on the second buffer layer.

Preferably, materials of the reflective layer are one or more combinations from the group of Mo, Al, AlNd, Cr, Cu, W, Ta or Ti, preferably material of the reflective layer is Mo, and the reflective layer is metal Mo layer.

Preferably, materials of the first buffer layer and the second buffer layer are one or two combinations of Silicon nitride and Silica.

Preferably, the first buffer layer is Silicon nitride layer, and the second buffer layer is Silica layer.

Further, the buffer layer comprises a first buffer layer and a second buffer layer is formed sequentially on the substrate, the insulation layer is formed on the second buffer layer, and the semiconductor layer is formed on the second buffer layer and the insulation layer.

Further, the insulation layer is alumina layer.

Preferably, materials of the first buffer layer and the second buffer layer are one or two combinations of Silicon nitride and Silica.

Preferably, the first buffer layer is Silicon nitride layer, and the second buffer layer is Silica layer.

Preferably, the substrate is glass substrate.

Besides, the disclosure also provides a manufacturing method for low temperature polycrystalline silicon thin film transistor comprising following steps:

providing a substrate;

forming a buffer layer on the substrate;

forming a reflective layer and/or an insulation layer on the buffer layer;

forming an amorphous silicon layer on the buffer layer, the reflective layer and/or the insulation layer, performing laser radiation to turn the amorphous silicon layer into a polycrystalline silicon layer, and the polycrystalline silicon layer is a semiconductor layer;

forming a gate insulation layer on the buffer layer and the semiconductor layer;

forming gates on the gate insulation layer;

forming a dielectric layer on the gate insulation layer and the gates;

forming a passivation layer on the dielectric layer;

forming a first contact hole and a second contact hole inside the passivation layer, the dielectric layer and the gate insulation layer;

and forming sources and drains respectively on the first contact hole and the second contact hole.

Preferably, a first buffer layer is deposited on the substrate, the reflective layer is deposited on the first buffer layer, and by applying photolithography and etching technology, a pattern is defined on the reflective layer; a second buffer layer is deposited on the first buffer layer and the reflective layer, and the reflective layer is covered into the second buffer layer; the amorphous silicon layer is deposited on the second buffer layer, and then by applying laser radiation, the amorphous silicon layer is turned into a polycrystalline silicon layer in order to obtain the semiconductor layer.

Preferably, materials of the reflective layer are one or more combination from the group of Mo, Al, AlNd, Cr, Cu, W, Ta or Ti, preferably material of the reflective layer is Mo, and the reflective layer is metal Mo layer.

Preferably, materials of the first buffer layer and the second buffer layer are one or two combinations of Silicon nitride and Silica.

Preferably, the first buffer layer is Silicon nitride layer, and the second buffer layer is Silica layer.

Preferably, a first buffer layer and a second buffer layer are formed sequentially on the substrate by depositing; the insulation layer is deposited on the second buffer layer, and by applying photolithography and etching technology, a pattern is defined on the insulation layer; the amorphous silicon layer is deposited on the second buffer layer and the insulation layer, and then by applying laser radiation, the amorphous silicon layer is turned into a polycrystalline silicon layer in order to obtain the semiconductor layer.

Further, the insulation layer is alumina layer.

Preferably, materials of the first buffer layer and the second buffer layer are one or two combinations of Silicon nitride and Silica.

Preferably, the first buffer layer is Silicon nitride layer, and the second buffer layer is Silica layer.

Optionally, the method for forming each layers structure of low temperature thin film transistor Chemical vapor deposition or Physical vapor deposition.

Optionally, in the step of "forming an amorphous silicon layer on the buffer layer, the reflective layer and/or the insulation layer, performing laser radiation to turn the amorphous silicon layer into a polycrystalline silicon layer, and the polycrystalline silicon layer is a semiconductor layer," the method of "performing laser radiation" is excimer laser anneal (ELA) or Solid Phase Crystallization (SPC)."

Preferably, the substrate is glass substrate.

Compare with present technology, the benefit of the present disclosure is as following:

In the disclosure, through setting the reflective layer and/or the insulation layer under the amorphous silicon layer, the laser radiation returns to the amorphous silicon layer from the reflective layer again after being through the amorphous silicon layer to enlarger the grain size or by insulation effect of the insulation layer to extend the time of crystallization of the amorphous silicon layer, and then the larger size of polycrystalline silicon grains are obtained. When the reflective layer and/or the insulation layer are only located inside the peripheral driving region, a polycrystalline silicon grain size by laser radiation is larger than a polycrystalline silicon grain size of the pixel region, and larger grain size may contribute better electron mobility in the peripheral driving region and thus contribute the driving efficiency in the peripheral driving region.

DETAILED DESCRIPTION OF THE EMBODIMENTS

Figure 1:
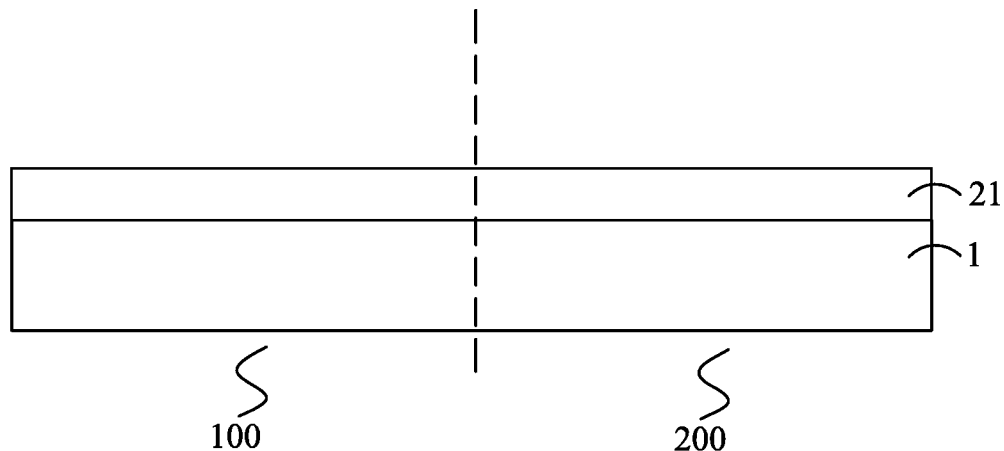
FIGS. 1 to 11 is a manufacturing process for low temperature polycrystalline silicon thin film transistor of a first embodiment.
Figure 2:
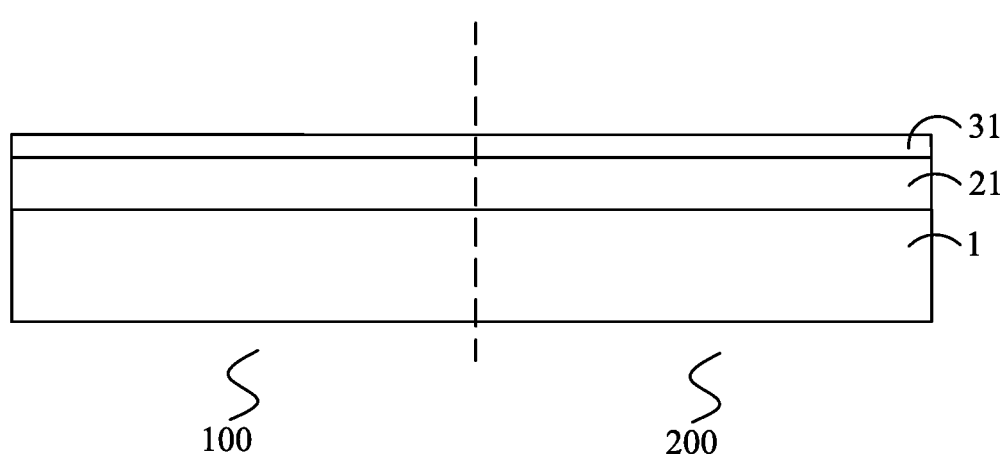
Figure 3:
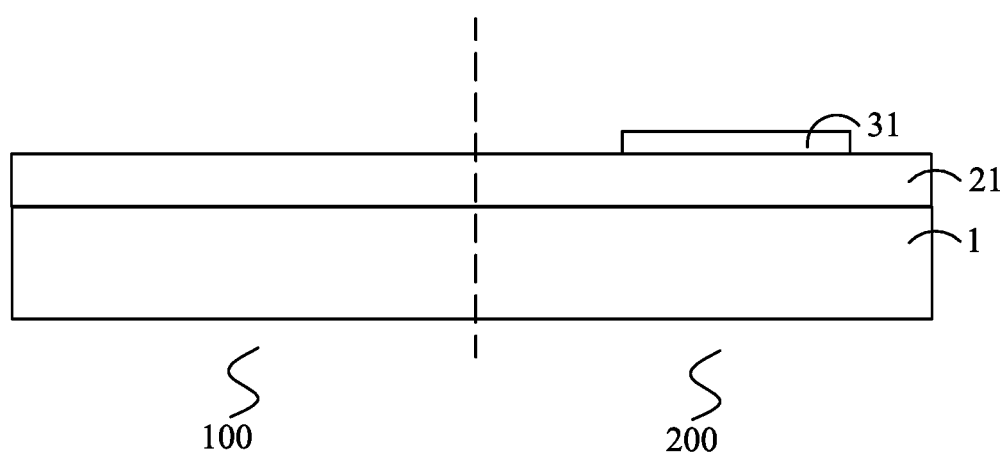
Figure 4:
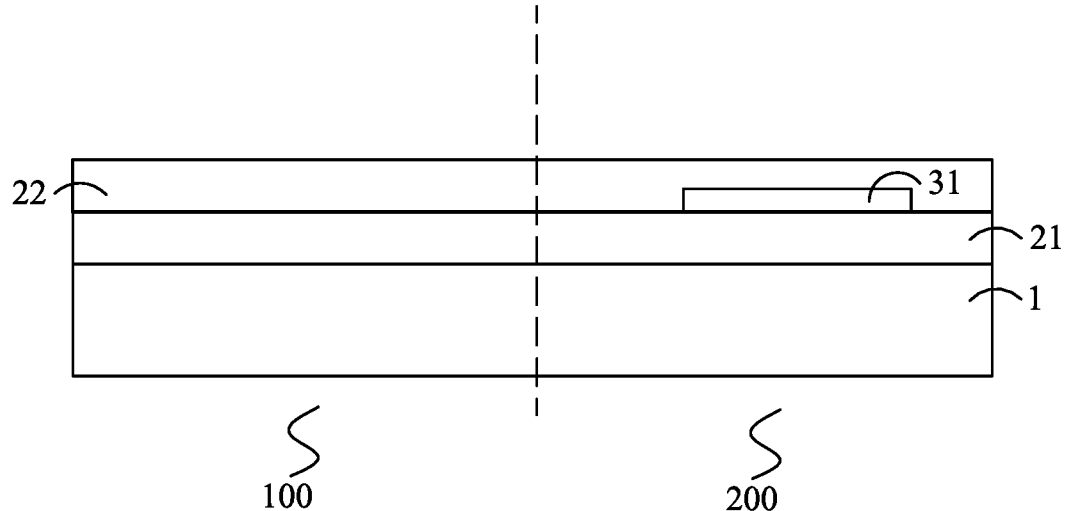

The embodiment provides a low temperature polycrystalline silicon thin film transistor, and the thin film transistor includes a pixel thin film transistor and a driving thin film transistor; the manufacturing method for the low temperature polycrystalline silicon thin film transistor is as follows:

As shown in FIG. 1, a glass substrate 1 is provided, and the glass substrate 1 includes a pixel region 100 on the left side and a peripheral driving region 200 on the right side. A pixel thin film transistor is formed inside the pixel region 100, and a driving thin film transistor for driving unit is formed inside the peripheral driving region 200. A first buffer layer 21 is formed on the glass substrate 1 by applying Chemical Vapor Deposition (CVD) method, and the first buffer layer 21 is Silicon nitride layer; then, as shown in FIG. 2, a metal Mo layer 31 is formed on the first buffer layer 21 by applying CVD method, and applies photolithography and etching technology to define a pattern as shown in FIG. 3. Through photolithography and etching technology, the metal Mo layer 31 located on the pixel region 100 is etched, and only the metal Mo layer 31 located on the peripheral driving region 200 is arranged; then as shown in FIG. 4, a second buffer layer 22 is formed on the first buffer layer 21 and the metal Mo layer 31 by applying CVD method, and the metal Mo layer 31 is covered inside the second buffer layer 22; the second buffer layer is Silica layer.

Figure 5:
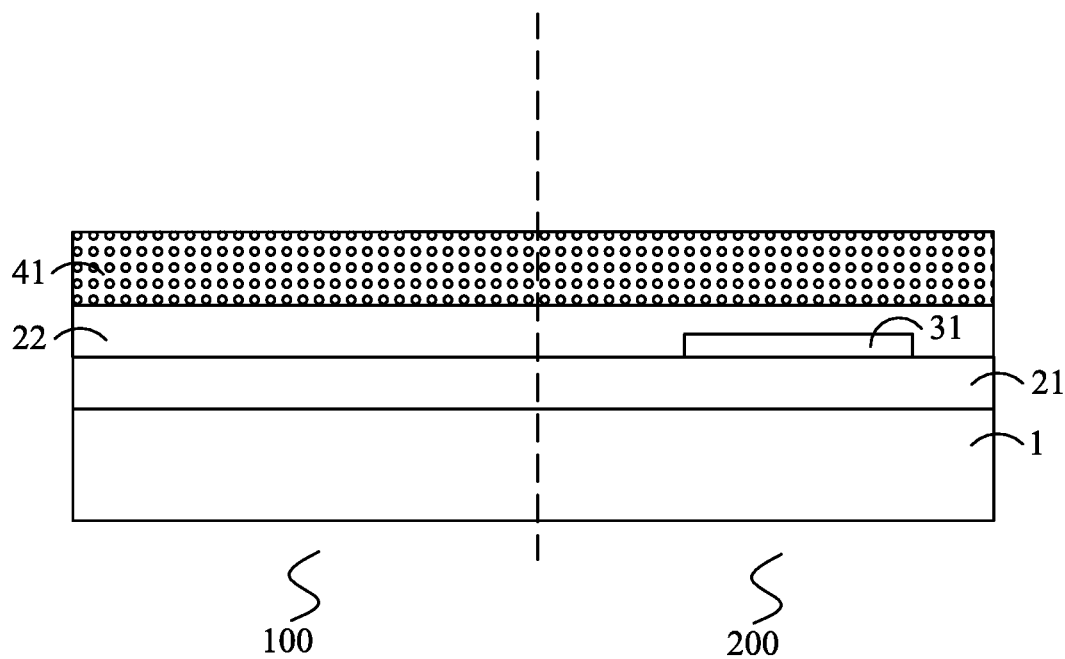
Figure 6:
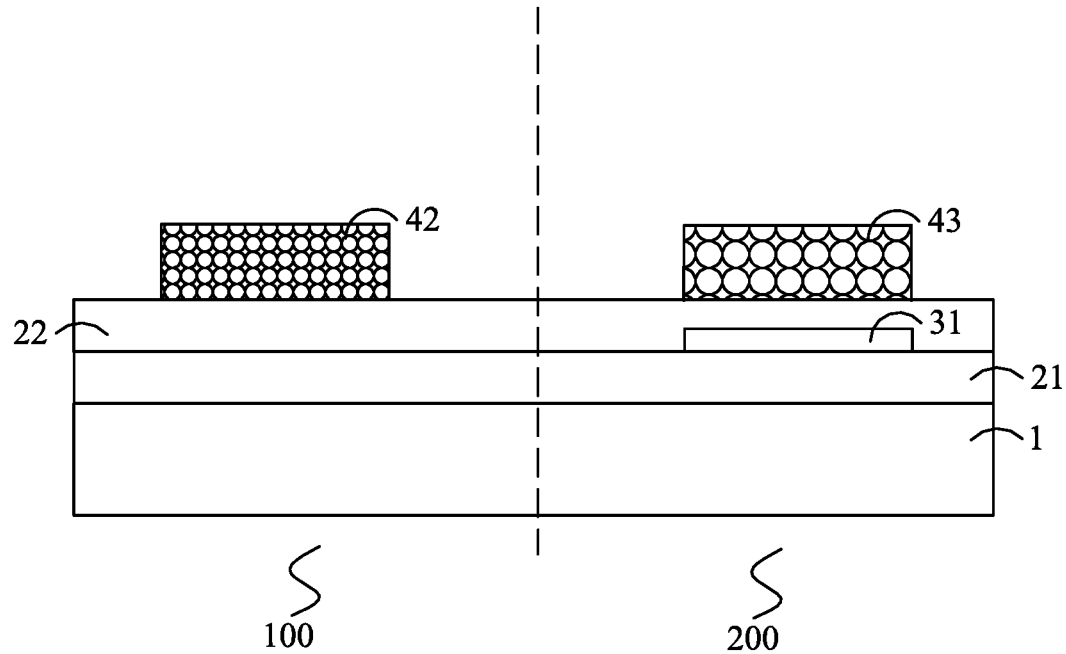

Then, as shown in FIG. 5, the amorphous silicon layer 41 is deposited on the second buffer layer 22 by applying CVD method, and by applying laser radiation or solid phase crystallization method, the amorphous silicon layer 41 is turned into a polycrystalline silicon layer 42 inside the pixel region 100 and a polycrystalline silicon layer 43 inside the peripheral driving region 200; In the embodiment, regarding to the amorphous silicon layer located inside the peripheral driving region, the crystallization procedure by applying ELA or SPC method is that the laser radiation returns to the amorphous silicon layer from the metal Mo layer again after being through the amorphous silicon layers that the amorphous silicon layer achieves insulation effect to improve results of grain and then the larger the grain size of the polycrystalline silicon layer is obtained. However, the metal Mo layer is not provided under the amorphous silicon layer inside the pixel region so that a grain size of the polycrystalline silicon formed inside the peripheral driving region is larger than a grain size of the polycrystalline silicon formed inside the pixel region. It could be understood that any other material having reflective properties may be substituted for the metal Mo layer in the embodiment, for example any combination of one or more of Al, AlNd, Cr, Cu, W, Ta or Ti.

Figure 7:
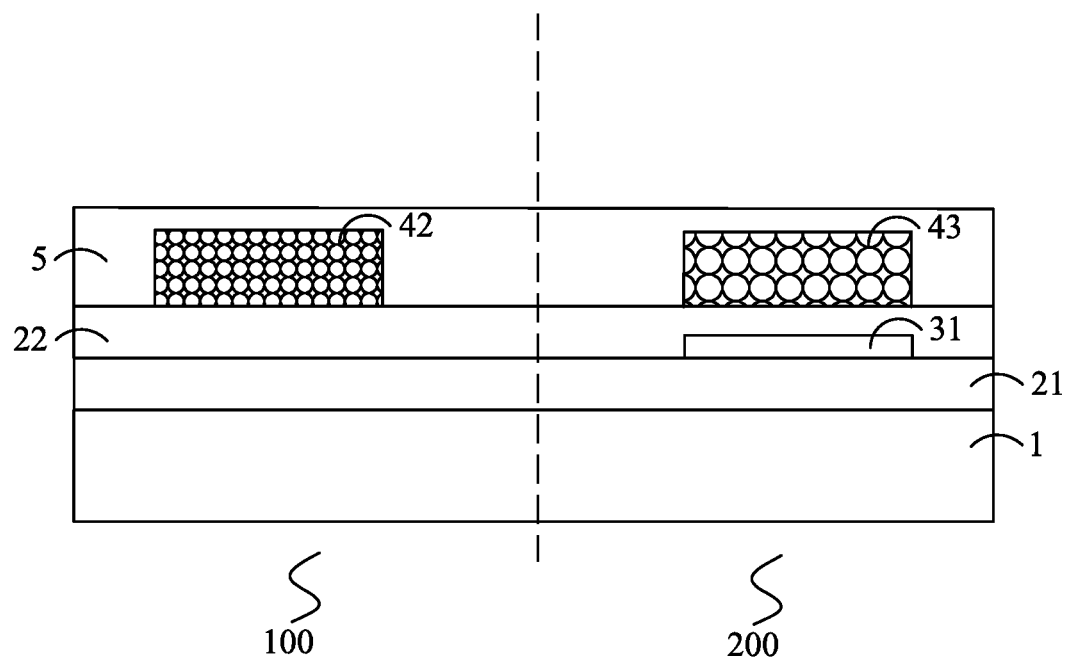
Figure 8:
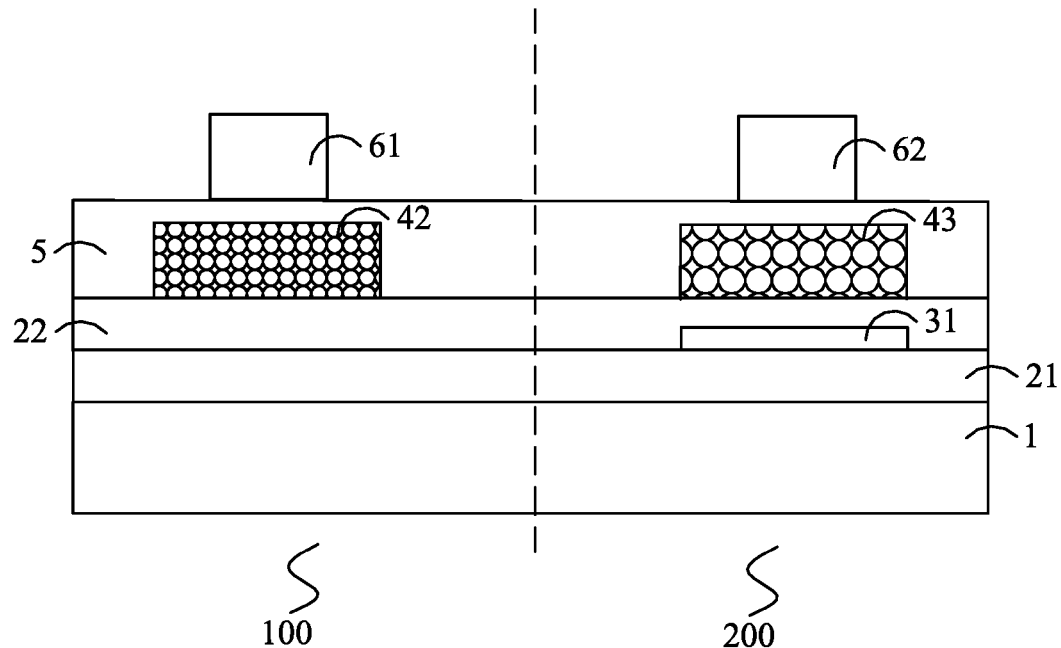

Then, as shown in FIG. 7, a gate insulation layer 5 is deposited on the second buffer layer 22, the polycrystalline silicon layer 42 and the polycrystalline silicon layer 43 by applying CVD method, and the polycrystalline silicon layer 42 and the polycrystalline silicon layer 43 are covered inside the gate insulation layer 5. Then, a gate 61 inside the pixel region 100 and a gate 62 inside the peripheral driving region 100 are deposited on the gate insulation layer 5 by applying CVD method, and a gate pattern is defined as shown in FIG. 8 by applying photolithography and etching technology.

Figure 9:
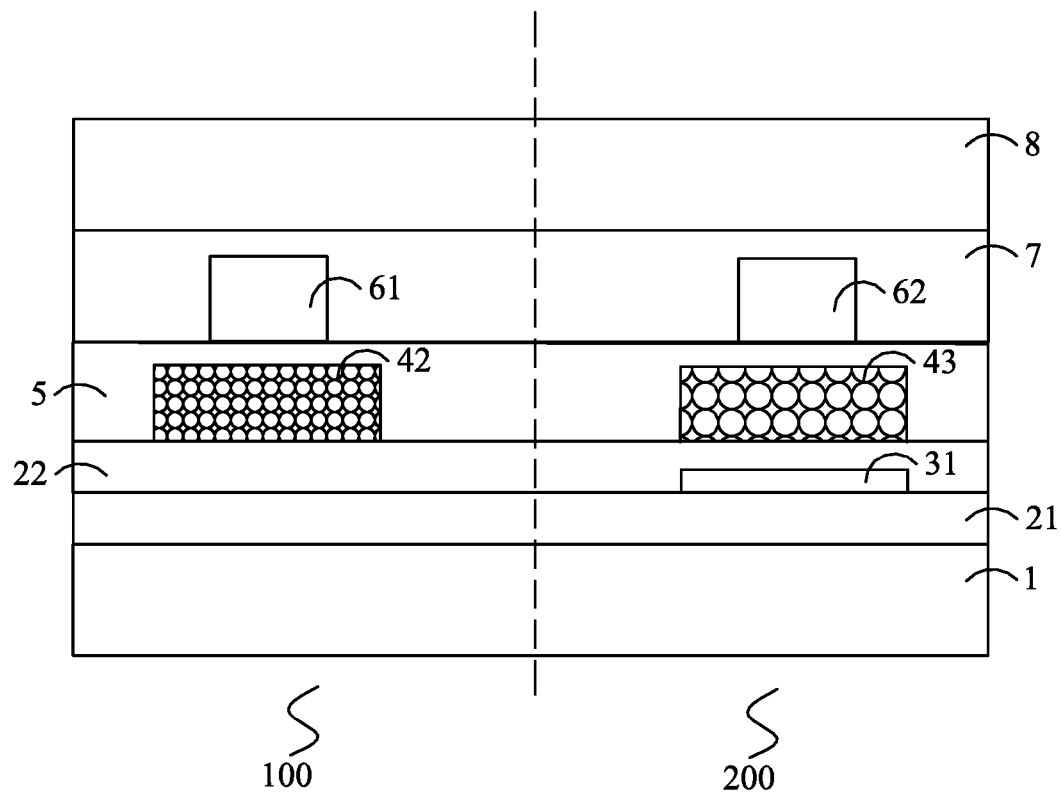

Then, as shown in FIG. 9, a dielectric layer 7 is deposited on the gate insulation layer 5, the gate 61 and the gate 62 by applying CVD method, and the gate 61 and the gate 62 are covered inside the dielectric layer 7; the dielectric layer 7 is Silica layer. Next, a passivation layer 8 is deposited on the dielectric layer 7 by applying CVD method, and the passivation layer 8 is Silica layer. And then, the passivation layer 8, the dielectric layer 7 and the gate insulation layer 5 is defined by photolithography and etching technology, and first contact holes 91, 93 and second contact holes 92, 94 are formed as shown in FIG. 10 so that the first contact holes and the second contact holes respectively connect to the surface of the polycrystalline silicon layer.

Figure 10:
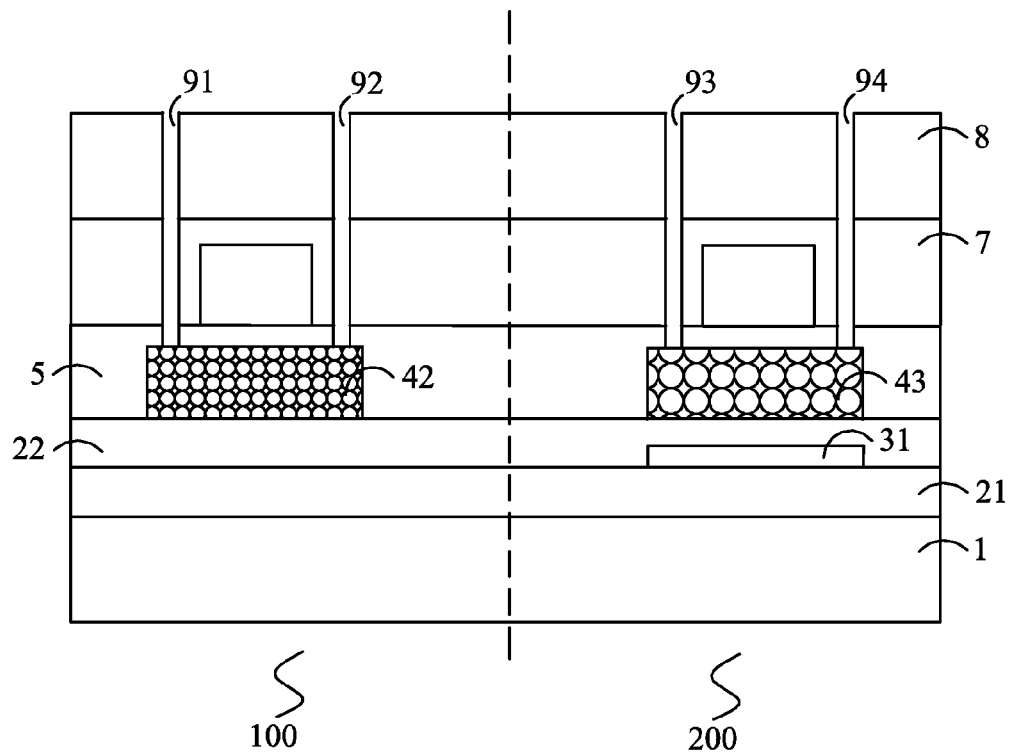
Figure 11:
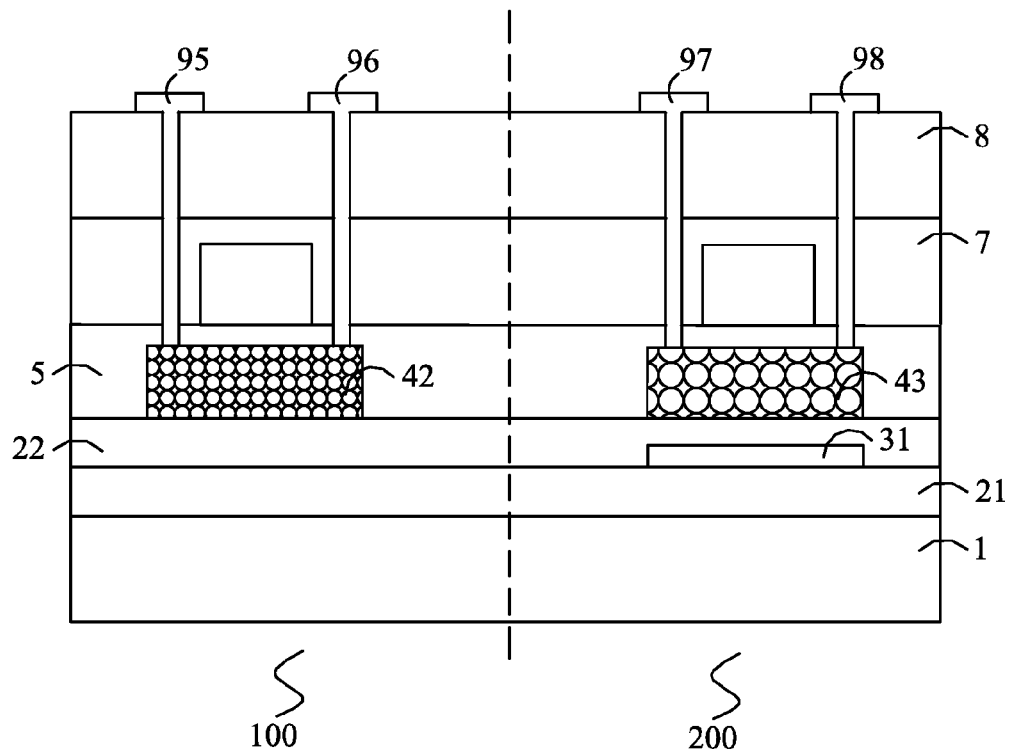

Then, a conductive layer is deposited on the first contact holes 91, 93 and the second contact holes 92, 94 by applying CVD method, and sources 95, 97 and drains 96, 98 are defined as shown in FIG. 10 by applying photolithography and etching technology, wherein the source 95 and the drain 96 are located at the pixel region 100, and the source 97 and the drain 98 are located at the peripheral driving region 200.

In the disclosure, photolithography is a technology that the particular portion of film of the wafer surface is eliminated by series of manufacturing steps. After that, a micro pattern structure of film is retained on the wave surface. Through photolithography technics process, the particular portion is finally retained on the wafer. The technology is a common technics art in the area of manufacturing thin film, and the descriptions are not repeated here.

Etching technology means that materials are removed by applying chemical reaction or physical shock. The technology is a common technics art in the area of manufacturing thin film, and the descriptions are not repeated here.

Figure 12:
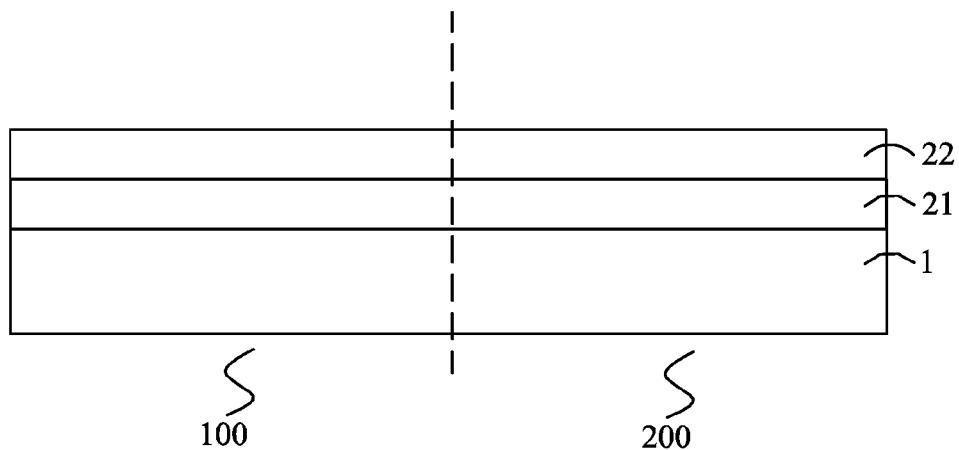
FIGS. 12 to 21 is a manufacturing process for low temperature polycrystalline silicon thin film transistor of a second embodiment.
Figure 13:
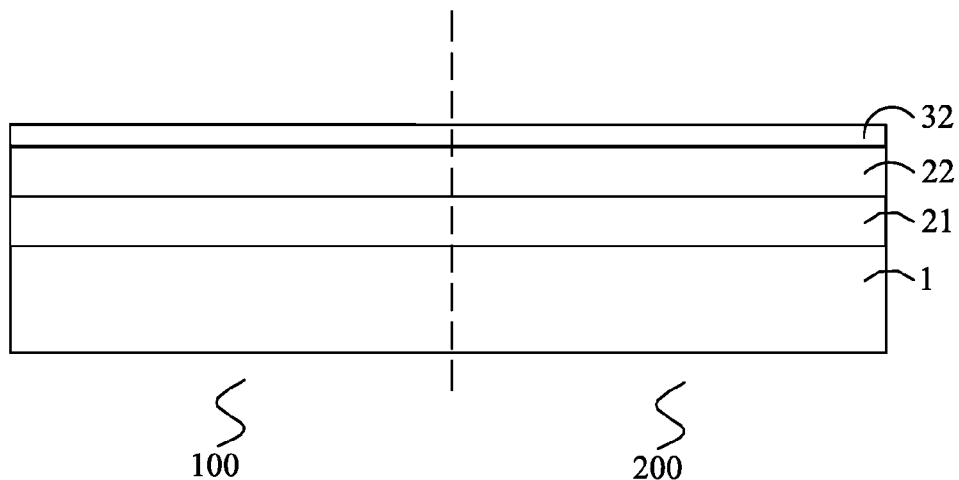
Figure 14:
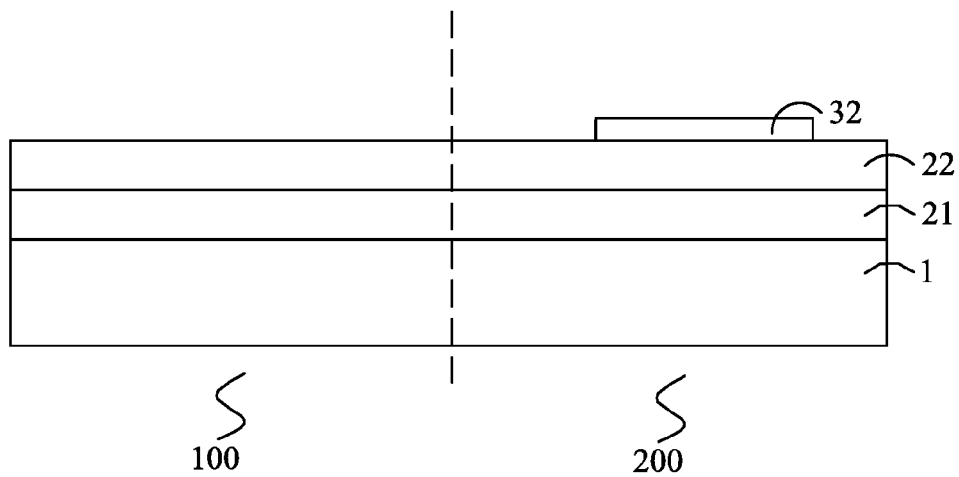

The embodiment provides a low temperature polycrystalline silicon thin film transistor, and the thin film transistor includes a pixel thin film transistor and a driving thin film transistor; the manufacturing method for the low temperature polycrystalline silicon thin film transistor is as follows:

As shown in FIG. 12, a glass substrate 1 is provided, and the glass substrate 1 includes a pixel region 100 on the left side and a peripheral driving region 200 on the right side. A pixel thin film transistor is formed inside the pixel region 100, and a driving thin film transistor for driving unit is formed inside the peripheral driving region 200. A first buffer layer 21 and a second buffer layer 22 are formed sequentially on the substrate 1 by depositing by applying CVD method, and the first buffer layer 21 is Silicon nitride layer; the first buffer layer is Silicon nitride layer, and the second buffer layer is Silica layer; then, as shown in FIG. 13, a alumina layer 32 for being insulation layer is deposited on the second buffer layer 22, and applies photolithography and etching technology to define a pattern of the alumina layer as shown in FIG. 14. In the embodiment, the alumina layer located on the pixel region 100 is etched by applying photolithography and etching technology, and the alumina layer is only located on the peripheral driving region 200.

Figure 15:
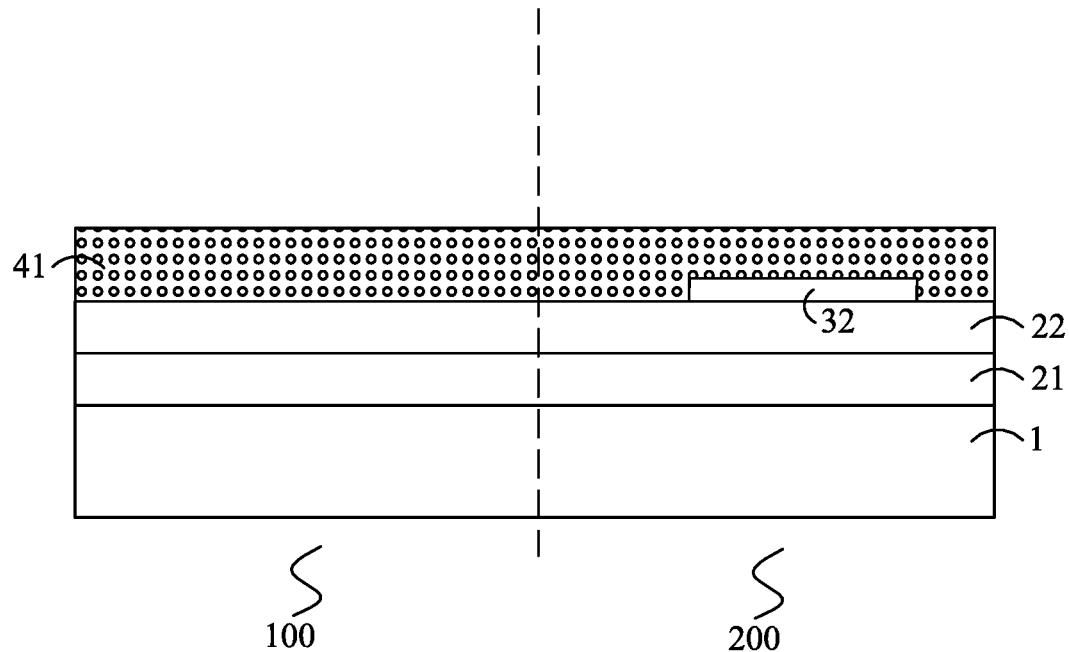
Figure 16:
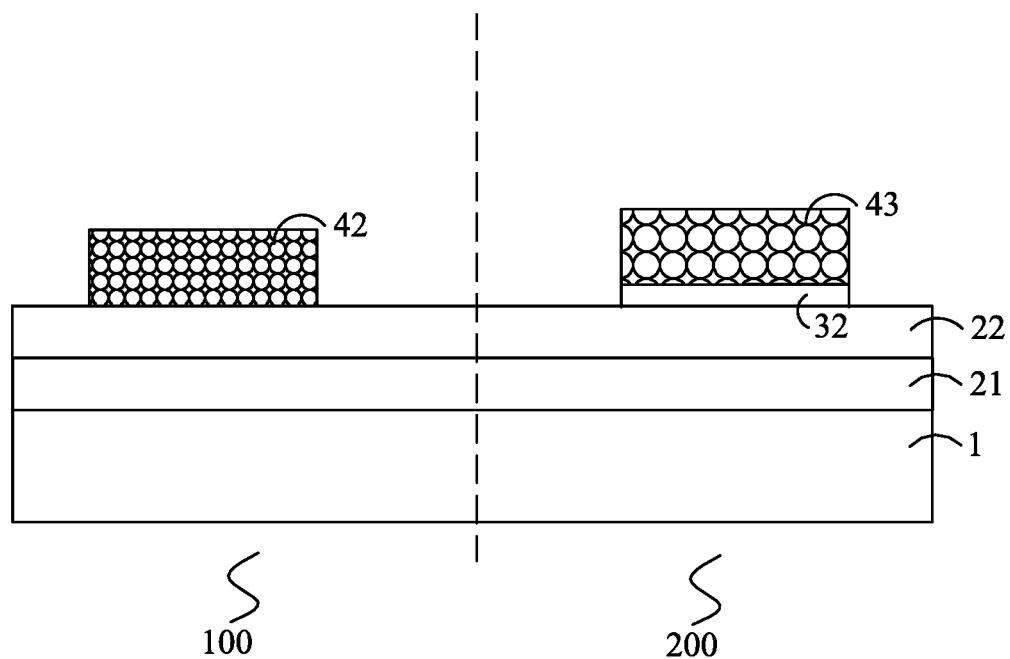

Then, as shown in FIG. 15, the amorphous silicon layer 41 is deposited on the second buffer layer 22 and the alumina layer 32 by applying CVD method, and the alumina layer is covered inside the amorphous silicon layer. By applying laser radiation or solid phase crystallization method, the amorphous silicon layer is turned into the polycrystalline silicon layer 42 located inside the pixel region 100 and the polycrystalline silicon layer 43 located inside the peripheral driving region 200, and then a polycrystalline silicon layer pattern is further defined as shown in FIG. 16 by applying photolithography and etching technology; wherein the polycrystalline silicon layer 42 located inside the peripheral driving region 200 corresponds to the top of the alumina layer 32. In the embodiment, for the amorphous silicon layer located inside the peripheral driving region, the crystallization procedure with applying ELA or SPC method is insulated by the alumina layer to extend the time of crystallization of the amorphous silicon layer to obtain the larger size of amorphous silicon layer grains because the alumina layer is set under the amorphous silicon layer having insulation effect. Larger grain size may contribute better electron mobility in the peripheral driving region and thus contribute the driving efficiency in the peripheral driving region.

Figure 17:
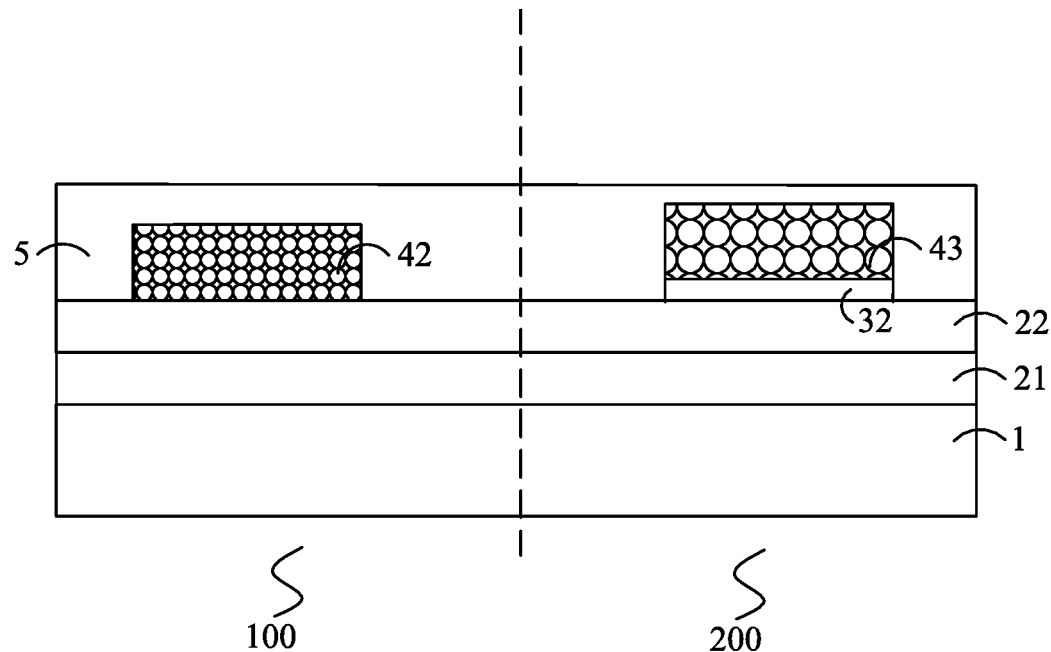
Figure 18:
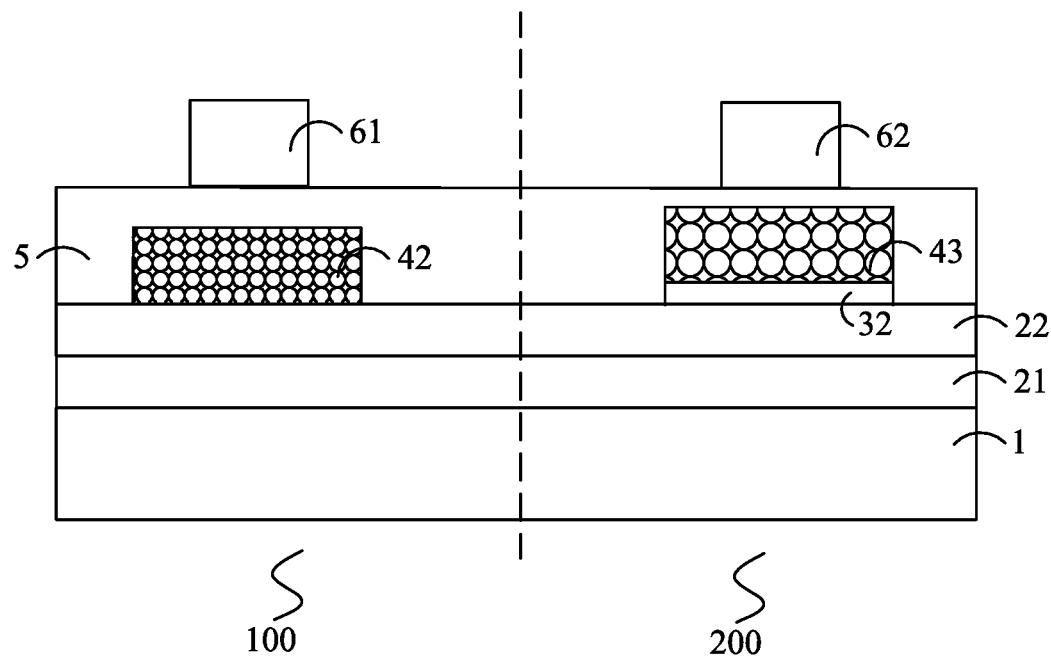

Then, as shown in FIG. 17, a gate insulation layer 5 is deposited on the second buffer layer 22, the polycrystalline silicon layer 42 and the polycrystalline silicon layer 43 by applying CVD method, and the polycrystalline silicon layer 42 and the polycrystalline silicon layer 43 are covered inside the gate insulation layer 5. Then, a gate 61 inside the pixel region 100 and a gate 62 inside the peripheral driving region 100 are deposited on the gate insulation layer 5 by applying CVD method, and a gate pattern is defined as shown in FIG. 18 by applying photolithography and etching technology.

Figure 19:
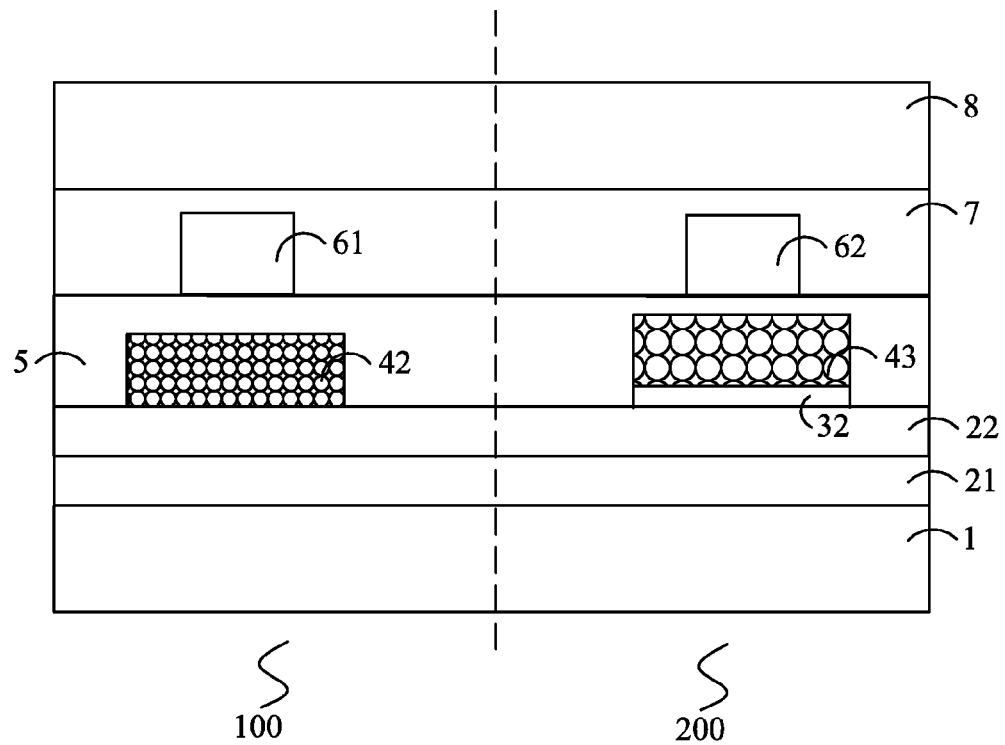
Figure 20:
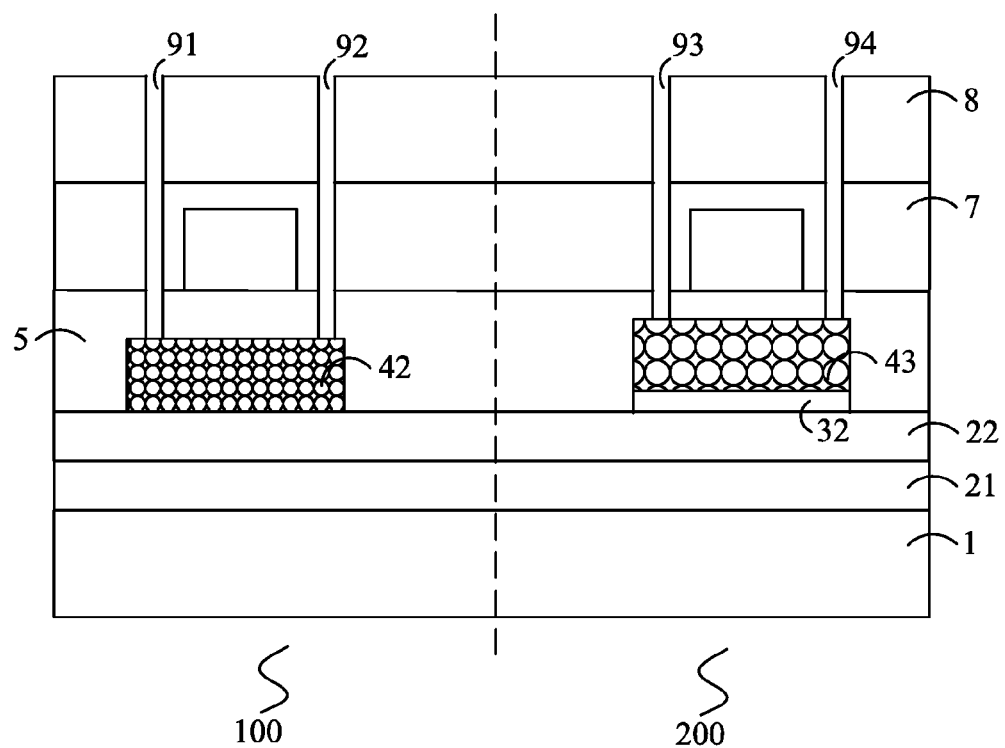

Then, as shown in FIG. 19, a dielectric layer 7 is deposited on the gate insulation layer 5, the gate 61 and the gate 62 by applying CVD method, and the gate 61 and the gate 62 are covered inside the dielectric layer 7; the dielectric layer 7 is Silica layer. Then, a passivation layer 8 is deposited on the dielectric layer 7 by applying CVD method, and the passivation layer 8 is Silica layer. Then, the passivation layer 8, the dielectric layer 7 and the gate insulation layer 5 is defined by photolithography and etching technology, and first contact holes 91, 93 and second contact holes 92, 94 are formed as shown in FIG. 20 so that the first contact holes 91, 93 and the second contact holes 92, 94 respectively connect to the surface of the polycrystalline silicon layer 42.

Figure 21:
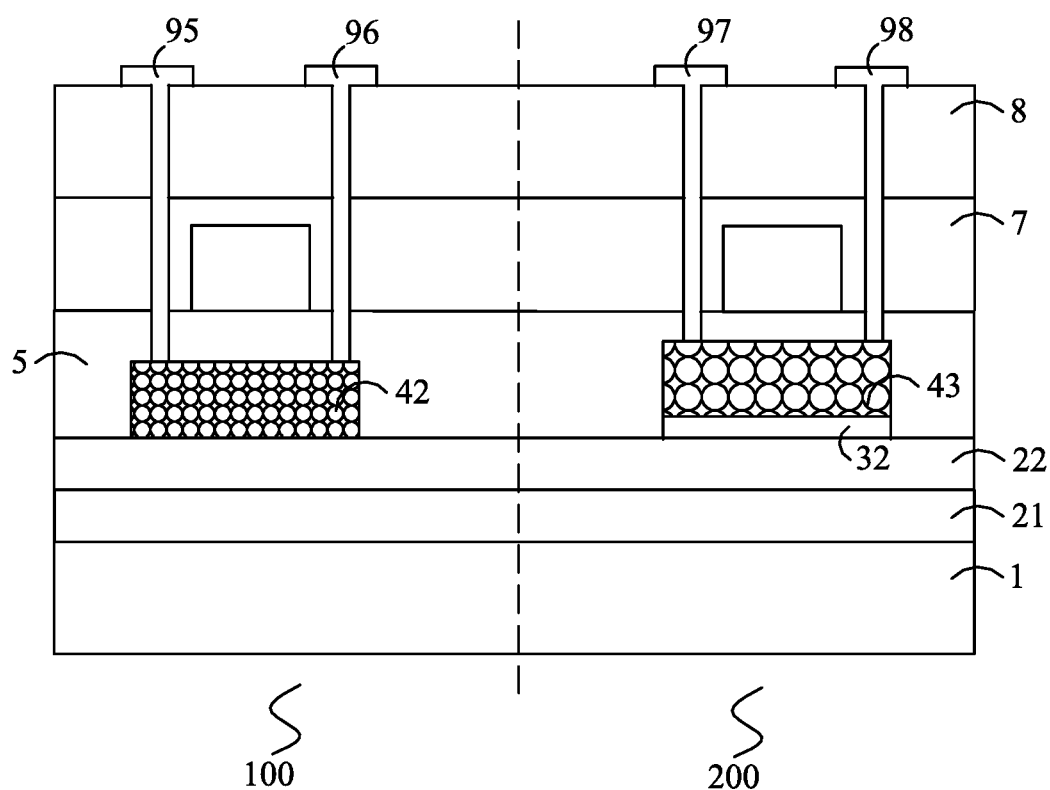

Then, a conductive layer is deposited on the first contact holes 91, 93 and the second contact holes 92, 94 of the polycrystalline silicon layer by applying CVD method and sources 95, 97 and drains 96, 98 are defined as shown in FIG. 21 by applying photolithography and etching technology, wherein the source 95 and the drain 96 are located at the pixel region 100, and the source 97 and the drain 98 are located at the peripheral driving region 200.

In the disclosure, photolithography is a technology that the particular portion of film of the wafer surface is eliminated by series of manufacturing steps. After that, a micro pattern structure of film is retained on the wave surface. Through photolithography technics process, the particular portion is finally retained on the wafer. The technology is a common technics art in the area of manufacturing thin film, and the descriptions are not repeated here.

Etching technology means that materials are removed by applying chemical reaction or physical shock. The technology is a common technics art in the area of manufacturing thin film, and the descriptions are not repeated here.

Embodiments of the present disclosure are described above, and the purpose is to provide an example to illustrate the present disclosure, not be limited. For the ordinary skill in the art, you can make various changes and modifications based on the above specification. Any modification, equivalent replacement and improvement within the spirit and principles of the present disclosure are also the scope of the present disclosure.

The invention claimed is:

1. A low temperature polycrystalline silicon thin film transistor, wherein: the low temperature polycrystalline silicon thin film transistor comprises: a substrate; a buffer layer formed on the substrate; a semiconductor layer formed on the buffer layer; a gate insulation layer formed on the buffer layer and the semiconductor layer; gates formed on the gate insulation layer; a dielectric layer formed on the gate insulation layer and the gates; a passivation layer formed on the dielectric layer; a first contact hole and a second contact hole formed respectively inside the passivation layer, the dielectric layer and the gate insulation layer, and sources ad drains source electrodes and drain electrodes formed respectively on the first contact hole and the second contact hole; and the semiconductor layer being a low temperature poly silicon layer, and one of a reflective layer and an insulation layer being disposed between the buffer layer and the semiconductor layer;

wherein the low temperature polycrystalline silicon thin film transistor comprises a pixel thin film transistor and a driving thin film transistor; the substrate comprises a pixel region and a peripheral driving region; the pixel region is used for forming the pixel thin film transistor; and the peripheral driving region is used for forming the driving thin film transistor;

the driving thin film transistor comprises a substrate located inside the peripheral driving region, and all the buffer layer, the semiconductor layer, the gate insulation layer, gates, the dielectric layer and the passivation layer are formed sequentially from the top on the substrate inside the peripheral driving region; the first contact hole and the second contact hole are formed respectively inside the passivation layer, the dielectric layer and the gate insulation layer, and the source electrodes and the drain electrodes are formed respectively on the first contact hole and the second contact hole; wherein the one of the reflective layer and the insulation layer is disposed between the buffer layer and the semiconductor layer; and wherein the pixel thin film transistor comprises: a substrate inside the pixel region, and all the buffer layer, the semiconductor layer, the gate insulation layer, gates, the dielectric layer and the passivation layer are formed sequentially from the top on the substrate inside the pixel region; the first contact hole and the second contact hole are formed respectively inside the passivation layer, the dielectric layer and the gate insulation layer, and the source electrodes and the drain electrodes are formed respectively on the first contact hole and the second contact hole.

2. A low temperature polycrystalline silicon thin film transistor of claim 1, wherein: a grain size of the semiconductor layer located inside the driving thin film transistor is larger than a grain size of the semiconductor layer located inside the pixel thin film transistor.

3. A low temperature polycrystalline silicon thin film transistor of claim 1, wherein: the buffer layer comprises a first buffer layer formed on the substrate, the reflective layer is formed on the first buffer layer, a second buffer is formed on the first buffer layer and the reflective layer, the reflective layer is covered inside the second buffer layer, and the semiconductor layer is formed on the second buffer layer.

4. A low temperature polycrystalline silicon thin film transistor of claim 1, wherein: the buffer layer comprises a first buffer layer and a second buffer layer is formed sequentially on the substrate, the insulation layer is formed on the second buffer layer, and the semiconductor layer is formed on the second buffer layer and the insulation layer.

5. A low temperature polycrystalline silicon thin film transistor, wherein: the low temperature polycrystalline silicon thin film transistor comprises: a substrate; a buffer layer formed on the substrate; a semiconductor layer formed on the buffer layer; a gate insulation layer formed on the buffer layer and the semiconductor layer; gates formed on the gate insulation layer; a dielectric layer formed on the gate insulation layer and the gates; a passivation layer formed on the dielectric layer; a first contact hole and a second contact hole formed respectively inside the passivation layer, the dielectric layer and the gate insulation layer, and source electrodes and drain electrodes formed respectively on the first contact hole and the second contact hole; and the semiconductor layer being a low temperature poly silicon layer, and a reflective layer being disposed between the buffer layer and the semiconductor layer;

wherein the buffer layer comprises a first buffer layer formed on the substrate; the reflective layer is formed on the first buffer layer; a second buffer is formed on the first buffer layer and the reflective layer; the reflective layer is covered inside the second buffer layer; and the semiconductor layer is formed on the second buffer layer.

6. A low temperature poly crystalline silicon thin film transistor of claim 5, wherein the low temperature polycrystalline silicon thin film transistor comprises a pixel thin film transistor and a driving thin film transistor; the substrate comprises a pixel region and a peripheral driving region; the pixel region is used for forming the pixel thin film transistor; and the peripheral driving region is used for forming the driving thin film transistor;

the driving thin film transistor comprises a substrate located inside the peripheral driving region, and all the buffer layer, the semiconductor layer, the gate insulation layer, gates, the dielectric layer and the passivation layer are formed sequentially from the top on the substrate inside the peripheral driving region; the first contact hole and the second contact hole are formed respectively inside the passivation layer, the dielectric layer and the gate insulation layer; and the source electrodes and the drain electrodes are formed respectively on the first contact hole and the second contact hole; wherein the reflective layer is disposed between the buffer layer and the semiconductor layer.

7. A low temperature polycrystalline silicon thin film transistor of claim 5, wherein the pixel thin film transistor comprises: a substrate inside the pixel region, and all the buffer layer, the semiconductor layer, the gate insulation layer, gates, the dielectric layer and the passivation layer are formed sequentially from the top on the substrate inside the pixel region; the first contact hole and the second contact hole are formed respectively inside the passivation layer, the dielectric layer and the gate insulation layer; and the source electrodes and the drain electrodes are formed respectively on the first contact hole and the second contact hole.

8. A low temperature polycrystalline silicon thin film transistor of claim 6, wherein a grain size of the semiconductor layer located inside the driving thin film transistor is larger than a grain size of the semiconductor layer located inside the pixel thin film transistor.

9. A low temperature polycrystalline silicon thin film transistor of claim 7, wherein a grain size of the semiconductor layer located inside the driving thin film transistor is larger than a grain size of the semiconductor layer located inside the pixel thin film transistor.

10. A low temperature polycrystalline silicon thin film transistor, wherein: the low temperature polycrystalline silicon thin film transistor comprises: a substrate; a buffer layer formed on the substrate; a semiconductor layer formed on the buffer layer; a gate insulation layer formed on the buffer layer and the semiconductor layer; gates formed on the gate insulation layer; a dielectric layer formed on the gate insulation layer and the gates; a passivation layer formed on the dielectric layer; a first contact hole and a second contact hole formed respectively inside the passivation layer, the dielectric layer and the gate insulation layer, and source electrodes and drain electrodes formed respectively on the first contact hole and the second contact hole; and the semiconductor layer being a low temperature poly silicon layer, and insulation layer being disposed between the buffer layer and the semiconductor layer;

wherein the buffer layer comprises a first buffer layer and a second buffer layer is formed sequentially on the substrate; the insulation layer is formed on the second buffer layer; and the semiconductor layer is formed on the second buffer layer and the insulation layer.

11. A low temperature polycrystalline silicon thin film transistor of claim 10, wherein the low temperature polycrystalline silicon thin film transistor comprises a pixel thin film transistor and a driving thin film transistor; the substrate comprises a pixel region and a peripheral driving region; the pixel region is used for forming the pixel thin film transistor; and the peripheral driving region is used for forming the driving thin film transistor;

the driving thin film transistor comprises a substrate located inside the peripheral driving region, and all the buffer layer, the semiconductor layer, the gate insulation layer, gates, the dielectric layer and the passivation layer are formed sequentially from the top on the substrate inside the peripheral driving region; the first contact hole and the second contact hole are formed respectively inside the passivation layer, the dielectric layer and the gate insulation layer; and the source electrodes and the drain electrodes are formed respectively on the first contact hole and the second contact hole; wherein the insulation layer is disposed between the buffer layer and the semiconductor layer.

12. A low temperature polycrystalline silicon thin film transistor of claim 10, wherein the pixel thin film transistor comprises: a substrate inside the pixel region, and all the buffer layer, the semiconductor layer, the gate insulation layer, gates, the dielectric layer and the passivation layer are formed sequentially from the top on the substrate inside the pixel region; the first contact hole and the second contact hole are formed respectively inside the passivation layer, the dielectric layer and the gate insulation layer; and the source electrodes and the drain electrodes are formed respectively on the first contact hole and the second contact hole.

13. A low temperature poly crystalline silicon thin film transistor of claim 11, wherein a grain size of the semiconductor layer located inside the driving thin film transistor is larger than a grain size of the semiconductor layer located inside the pixel thin film transistor.

14. A low temperature polycrystalline silicon thin film transistor of claim 12, wherein a grain size of the semiconductor layer located inside the driving thin film transistor is larger than a grain size of the semiconductor layer located inside the pixel thin film transistor.

* * * * *